United States Patent
Lee et al.

(10) Patent No.: US 7,202,935 B2
(45) Date of Patent: Apr. 10, 2007

(54) IMPRINTING APPARATUS WITH INDEPENDENTLY ACTUATING SEPARABLE MODULES

(75) Inventors: Jae Jong Lee, Daejeon (KR); Kee Bong Choi, Daejeon (KR); Gee Hong Kim, Daejeon (KR); Kwang Jo Chung, Daejeon (KR)

(73) Assignee: Korea Institute of Machinery & Materials (KR)

( * ) Notice: Subject to any disclaimer, the term of this patent is extended or adjusted under 35 U.S.C. 154(b) by 235 days.

(21) Appl. No.: 10/919,806

(22) Filed: Aug. 17, 2004

(65) Prior Publication Data

US 2005/0178280 A1 Aug. 18, 2005

(30) Foreign Application Priority Data

Feb. 18, 2004 (KR) .................... 10-2004-0010591

(51) Int. Cl.
*G03B 27/42* (2006.01)
*G03B 27/52* (2006.01)
*G03B 27/62* (2006.01)

(52) U.S. Cl. ............................ 355/53; 355/40; 355/75

(58) Field of Classification Search .................... None
See application file for complete search history.

(56) References Cited

U.S. PATENT DOCUMENTS

| | | | | | |
|---|---|---|---|---|---|
| 4,004,506 | A | * | 1/1977 | McInerny | 101/110 |
| 4,793,785 | A | * | 12/1988 | Osada | 425/116 |
| 6,954,275 | B2 | * | 10/2005 | Choi et al. | 356/614 |
| 2004/0141168 | A1 | * | 7/2004 | Sreenivasan et al. | 355/75 |
| 2006/0019504 | A1 | * | 1/2006 | Taussig | 438/903 |
| 2006/0032437 | A1 | * | 2/2006 | McMackin et al. | 118/100 |

FOREIGN PATENT DOCUMENTS

KR 20040086183 * 10/2004

* cited by examiner

*Primary Examiner*—D. Rutledge
(74) *Attorney, Agent, or Firm*—James C. Eaves, Jr.; Greenebaum Doll & McDonald PLLC

(57) ABSTRACT

An imprinting apparatus including a plate unit, and a plurality of imprinting modules provided on a lower surface of the plate unit. Each imprinting module is self-aligned by a compliance of six degree of freedom and vertically moved along with the plate unit by a controller. The imprint module is independently self-aligned in response to surface conditions of an objective material to compensate for a relative pose error thereof, such that a pattern formed on a lower end of the imprinting module can be imprinted on an upper surface of the objective material within a predetermined unit range, and a sequence of imprinting the pattern of the imprinting module on the objective material can be variously controlled.

6 Claims, 14 Drawing Sheets

IMPRINTING APPARATUS WITH INDEPENDENTLY ACTUATING SEPARABLE MODULES

BACKGROUND OF THE INVENTION

1. Field of the Invention

The present invention relates generally to imprinting apparatuses which form patterns on objective materials, such as wafers and substrates, and more particularly, to an imprinting apparatus, in which a plurality of imprinting modules each having a pattern are separably coupled to each other to control a range of imprinting the patterns on an upper surface of an objective material according to an area of the upper surface of the objective material, and an actuator of each of the plurality of imprinting modules is independently self-aligned in response to surface conditions of the objective material to compensate for a relative pose error of a mold of each of the imprinting modules with respect to the objective material while each of the actuators is independently actuated by a controller, so that a pattern formed on each of the molds is accurately imprinted on the upper surface of the objective material, thus reducing the number of defective products.

2. Description of the Related Art

Generally, patterns, such as high density integrate circuits, are formed on upper surfaces of semiconductor wafers or substrates by imprinting apparatuses. That is, molds of the conventional imprinting apparatuses compress photosensitive materials, which are previously applied on the upper surfaces of objective materials, such as the semiconductor wafers or the substrates, so that the patterns of the molds are imprinted to the photosensitive materials on the objective materials.

There are two methods of forming the patterns on the objective materials using the conventional imprinting apparatuses. As shown in FIG. 1, the first is a method in which only one actuator with a single mold 1 is repeatedly and vertically actuated to imprint a pattern 2 of the mold 1 on an objective material W. Thus, the pattern 2 is repeatedly imprinted on each of a plurality of portions of an upper surface of the objective material W according to an imprinting sequence designated by the reference numerals 1 through 37, as shown in FIG. 3. The second is a method in which a plurality of patterns 4 are formed on a lower surface of a mold 3, as shown in FIG. 2, so that the plurality of patterns 4 are simultaneously imprinted on the objective material W at one time, as shown in FIG. 4.

However, in the first method in which the actuator with the single mold 1 is repeatedly and vertically actuated to imprint the patterns 2 on the objective material W, as shown in FIG. 1, a required imprinting time is increased in proposition to an increase in an area of imprinting the patterns on the objective material W. Furthermore, because the single mold 1 repeatedly imprints the same pattern 2 on each of the plurality of portions of the objective material W, accuracy of a conventional imprinting apparatus using the first method is reduces in response to increases in the number of repeated imprinting processes. Thus, the desired patterns may not be imprinted on the objective material W by deformation of the pattern 2 of the mold 1.

In addition, the conventional imprinting apparatus using the first method cannot be used in case that patterns of various types must be imprinted on the objective material W.

In the second method in which the patterns 4 on the mold 3 are imprinted on the objective material W at one time, when the upper surface of the objective material W is not leveled, the patterns 4 are not evenly imprinted. Thus, a defective product may result.

Typically, the objective material W, on which the patterns are imprinted, is supported on a vacuum chuck 5 by an absorption method. At this time, a predetermined portion of the objective material W, to which the absorption operation of the vacuum chuck 5 is practically executed, is slightly depressed in comparison with other portions of the objective material W. When the depressed portion of the objective material W is measured in a nano-scaled measurement, the upper surface of the depressed portion of the objective material W is curved, as shown in FIGS. 1 and 2. Therefore, in the conventional imprinting apparatus using the second imprinting method, the patterns formed on the mold 3 may not be evenly imprinted on the objective material W with the depressed portion, thus increasing the numbers of defective products.

Furthermore, because the mold 3 of the conventional imprinting apparatus using the second method has a larger imprinting area, air is not efficiently removed from a gap defined between the mold 3 and the objective material W while the patterns 4 of the mold 3 are imprinted on the objective material W. Therefore, the conventional imprinting apparatus using the second method is problematic in that a plurality of air pockets are undesirably generated on the imprinted surface of the objective material W, thus causing defective products.

As described above, the methods of imprinting the patterns on the objective material using the conventional imprinting apparatuses are limited in the two methods of repeatedly imprinting the single pattern or imprinting the patterns using the single mold 3 with the larger area at one time. Therefore, in case that the range of imprinting the patterns is changed, conventional imprinting apparatuses must change existing imprinting processes into new imprinting processes according to the range of imprinting the patterns. Otherwise, it may be impossible to use the conventional imprinting apparatuses in the different imprinting processes.

SUMMARY OF THE INVENTION

Accordingly, the present invention has been made keeping in mind the above problems occurring in the prior art, and an object of the present invention is to provide an imprinting apparatus, in which a plurality of imprinting modules each having a pattern are separably coupled to each other to control a range of imprinting the patterns on an upper surface of an objective material according to an area of the upper surface of the objective material, and an actuator of each of the plurality of imprinting modules is independently self-aligned in response to surface conditions of the objective material to compensate for a relative pose error of a mold of each of the imprinting modules with respect to the objective material while each of the actuators is independently actuated by a controller, so that a pattern formed on each of the molds is accurately imprinted on the upper surface of the objective material, thus reducing the number of defective products.

In order to accomplish the above object, the present invention provides an imprinting apparatus, including a plate unit, and a plurality of imprinting modules provided on a lower surface of the plate unit so that each of the plurality of imprinting modules is self-aligned by a compliance of six degrees of freedom, and is vertically moved along with the plate unit by a controller. Each of the imprinting modules is independently self-aligned in response to surface conditions of an objective material to compensate for a relative pose error of each of the imprinting modules with respect to the objective material, so that a pattern formed on a lower end of each of the plurality of imprinting modules is imprinted on an upper surface of the objective material within a predetermined unit range, and a sequence of imprinting the patterns of the plurality of imprinting modules on the objective material is variously controlled.

The plate unit may be vertically moved by a separate drive unit, and each of the plurality of imprinting modules may be provided on the lower surface of the plate unit to be independently self-aligned by the compliance of the six degrees of freedom to imprint the pattern formed on the lower end of each of the imprinting modules on the upper surface of the objective material. Each of the plurality of imprinting modules may include an actuator provided under the plate unit to be independently actuated by the controller, with a mold attached on a lower end of the actuator and having the pattern on a lower surface thereof, so that the mold of the actuator is in surface contact with the upper surface of the objective material while the actuator is actuated by the controller, a bonding unit provided between the lower end of the actuator and the mold to attach the mold to the lower end of the actuator, and a compensator comprising an outer frame provided on the lower surface of the plate unit, and an inner frame placed in the outer frame so that the inner frame is self-aligned by the compliance of six degrees of freedom. The inner frame may have on a lower end thereof the actuator, so that the actuator along with the inner frame executes a horizontal and vertical translational motion, a wobbling motion and a rotational motion in response to the conditions of the upper surface of the objective material when the pattern of the mold is imprinted on the upper surface of the objective material, thus compensating for a relative pose error of the mold with respect to the objective material.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
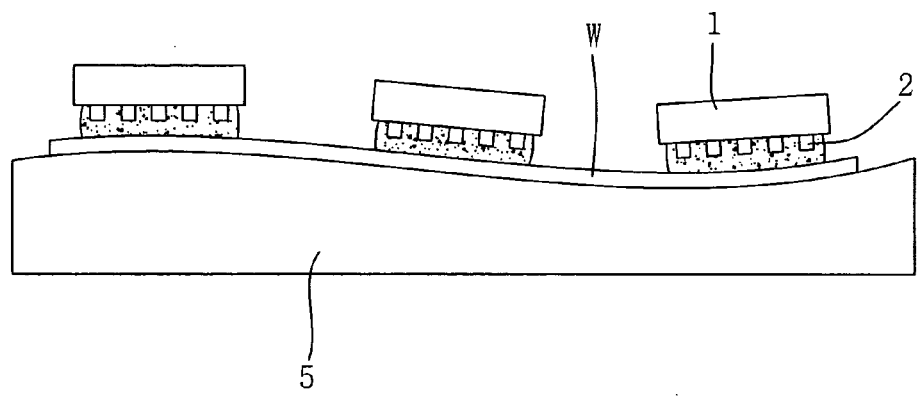
FIG. 1 is a view showing a first method of imprinting desired patterns on an objective material using a first conventional imprinting apparatus with a single mold having a single pattern.
Figure 2:
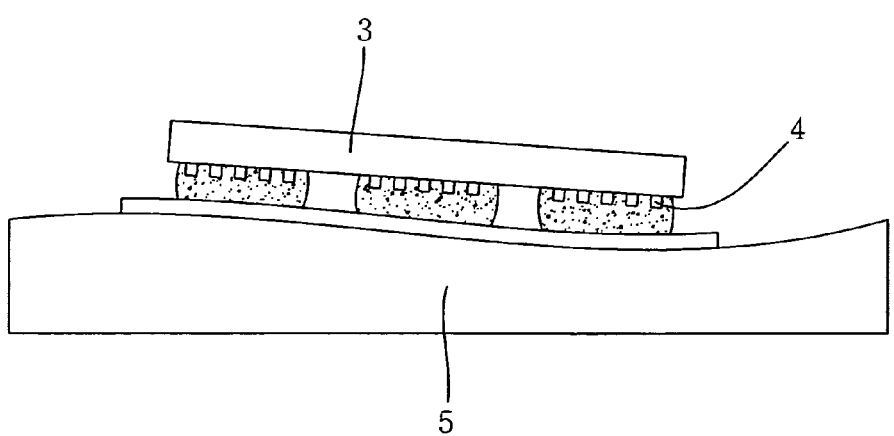
FIG. 2 is a view showing a second method of imprinting patterns on an objective material using a second conventional imprinting apparatus having a single mold with a plurality of patterns.
Figure 3:
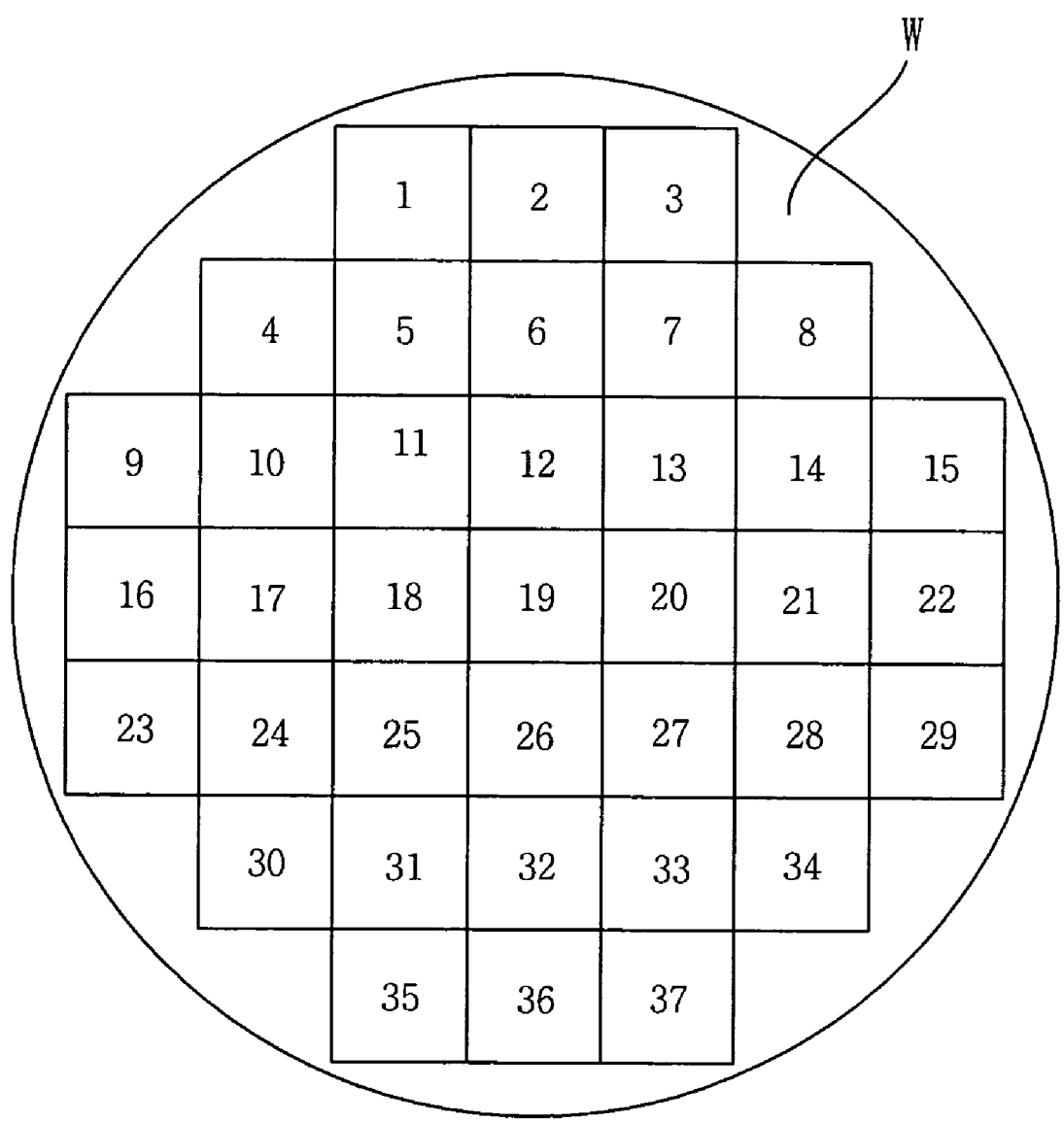
FIG. 3 is a plan view showing the objective material on which the patterns are imprinted by the first conventional imprinting apparatus using the first imprinting method described in FIG. 1 according to a sequence designated by the reference numerals 1 through 37.
Figure 4:
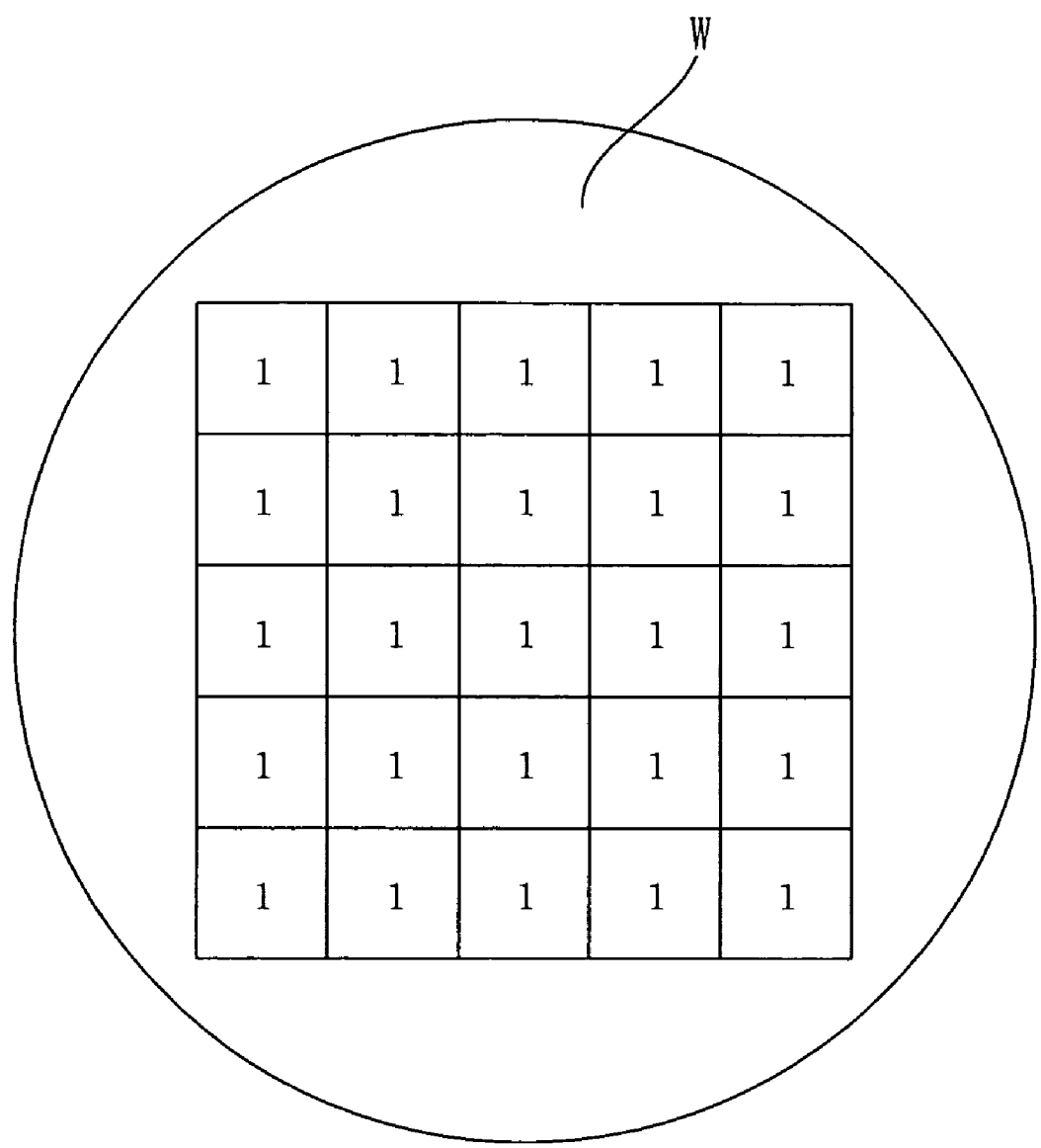
FIG. 4 is a plan view showing the objective material on which the patterns are imprinted by the second conventional imprinting apparatus using the second imprinting method described in FIG. 2 at one time.

Hereinafter, embodiments of the present invention will be described in detail with reference to the attached drawings.

Reference now should be made to the drawings, in which the same reference numerals are used throughout the different drawings to designate the same or similar components.

As shown in FIGS. 6 through 16, an imprinting apparatus 10 according to the present invention appropriately controls a range of imprinting patterns P on an objective material W while controlling the number of imprinting modules 12 each having the pattern P according to an area of the objective material W. Each of the plurality of imprinting modules 12 is provided to a plate unit 11 to be independently self-aligned in response to surface conditions of the objective material W by a controller (not shown). Thus, a relative pose error of each of the imprinting modules 12 with respect to the objective material W is compensated. Furthermore, a user controls a sequence along which the plurality of imprinting modules 12 are sequentially removed from the objective material W after executing the process of imprinting the patterns P on the objective material W.

Figure 5:
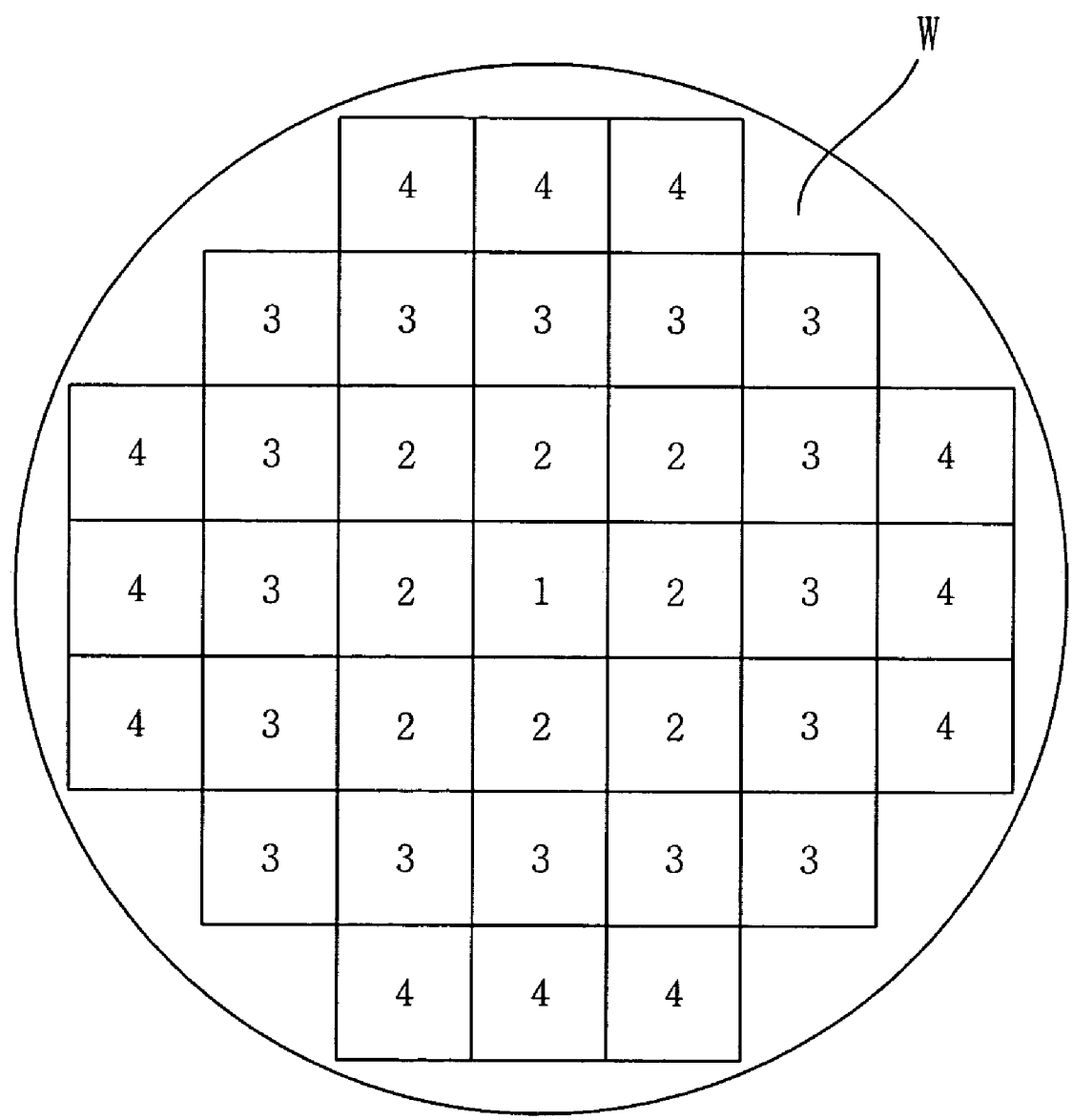
FIG. 5 is a view showing a sequence designated by the reference numerals 1 through 4 along which a plurality of modules of an imprinting apparatus are sequentially removed from an objective material after executing an imprinting process using the imprinting apparatus according to an embodiment of the present invention.

For example, FIG. 5 is a view of showing an example of the sequence designated by the reference numerals 1 through 4 along which the plurality of imprinting modules 12 are sequentially removed from the objective material W. As shown in FIG. 5, after the patterns P are simultaneously imprinted on the objective material W, the plurality of imprinting modules 12 are sequentially removed from the objective material W from a central portion to outside portions of the objective material W. It is almost impossible to execute the above-mentioned process of removing molds each having the pattern from the objective material W according to the sequence shown in FIG. 5 when using conventional imprinting apparatuses.

Figure 6:
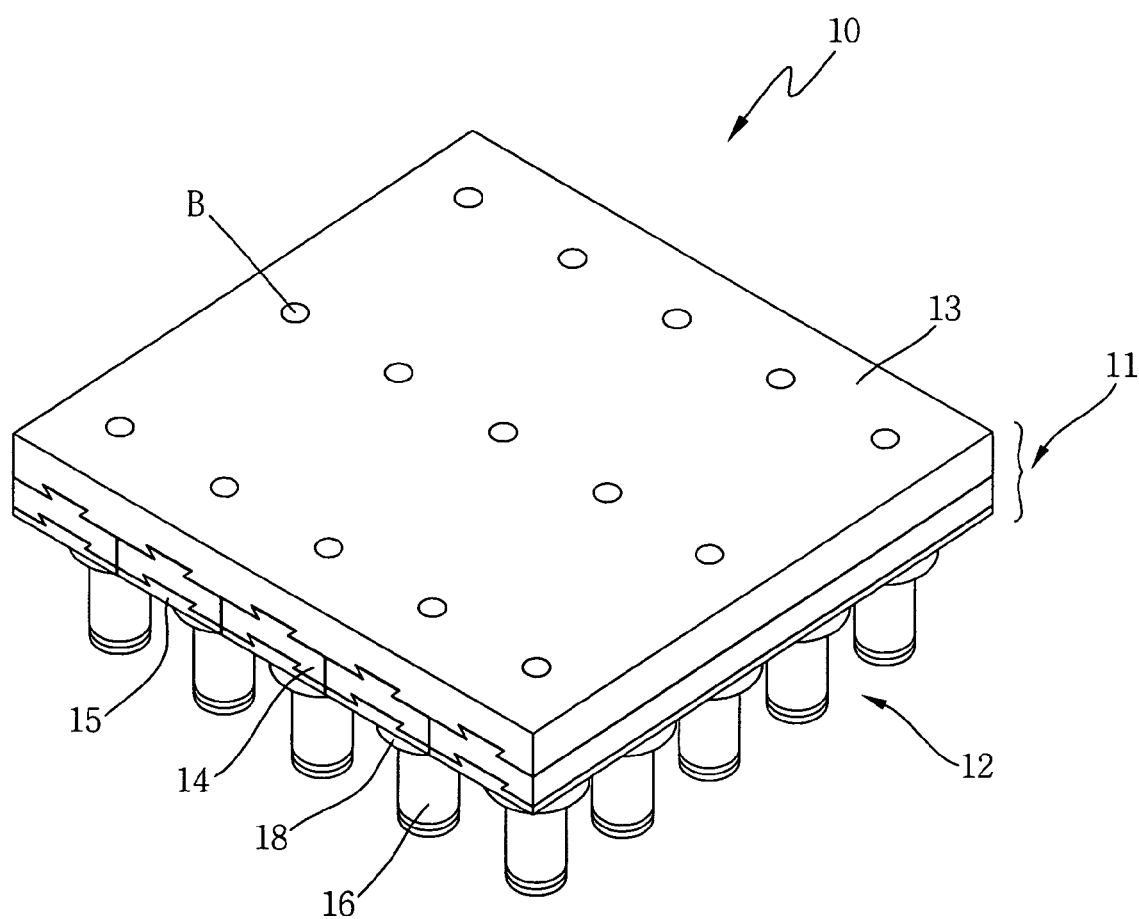
FIG. 6 is a perspective view of the imprinting apparatus, according to the embodiment of the present invention.
Figure 7:
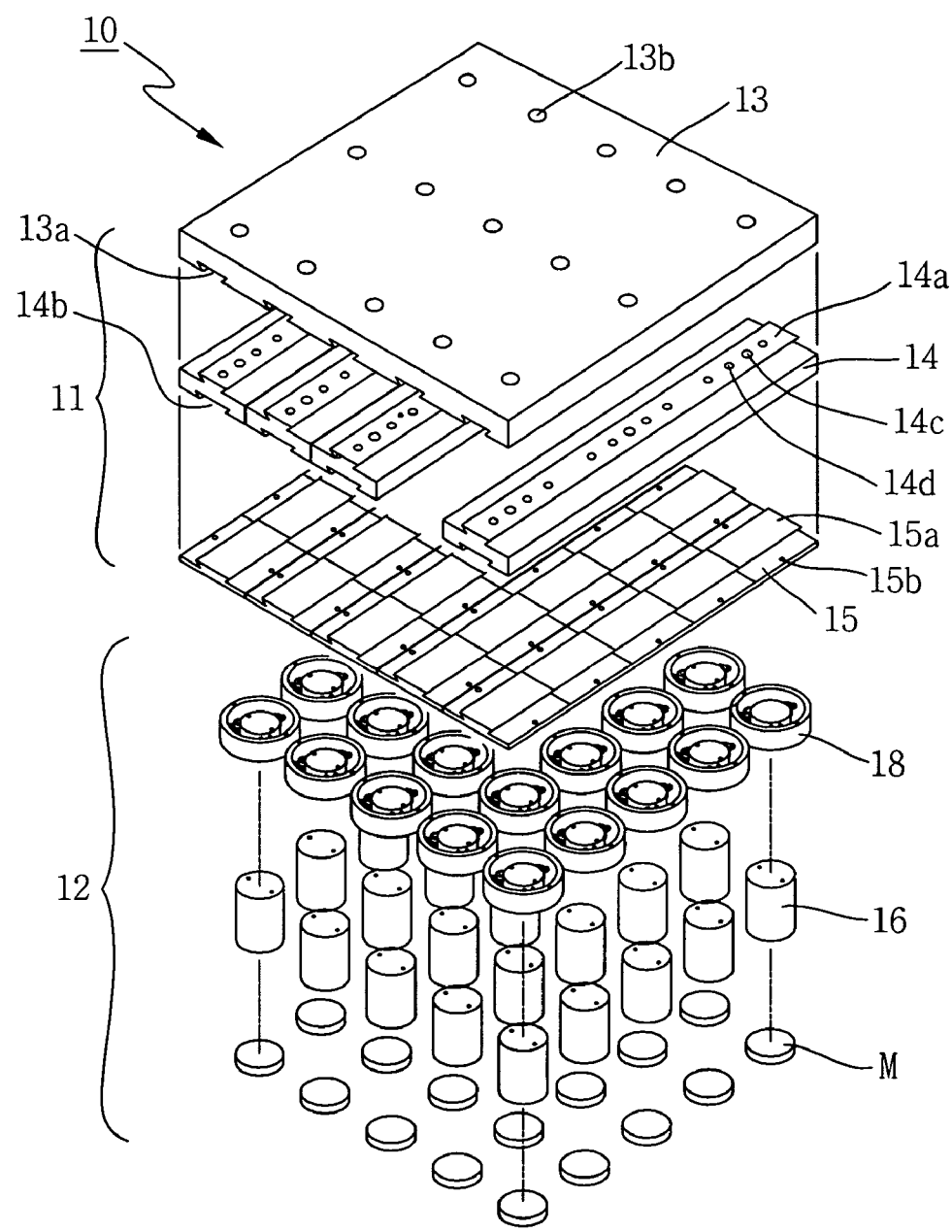
FIG. 7 is an exploded perspective view of the imprinting apparatus of FIG. 6.
Figure 8:
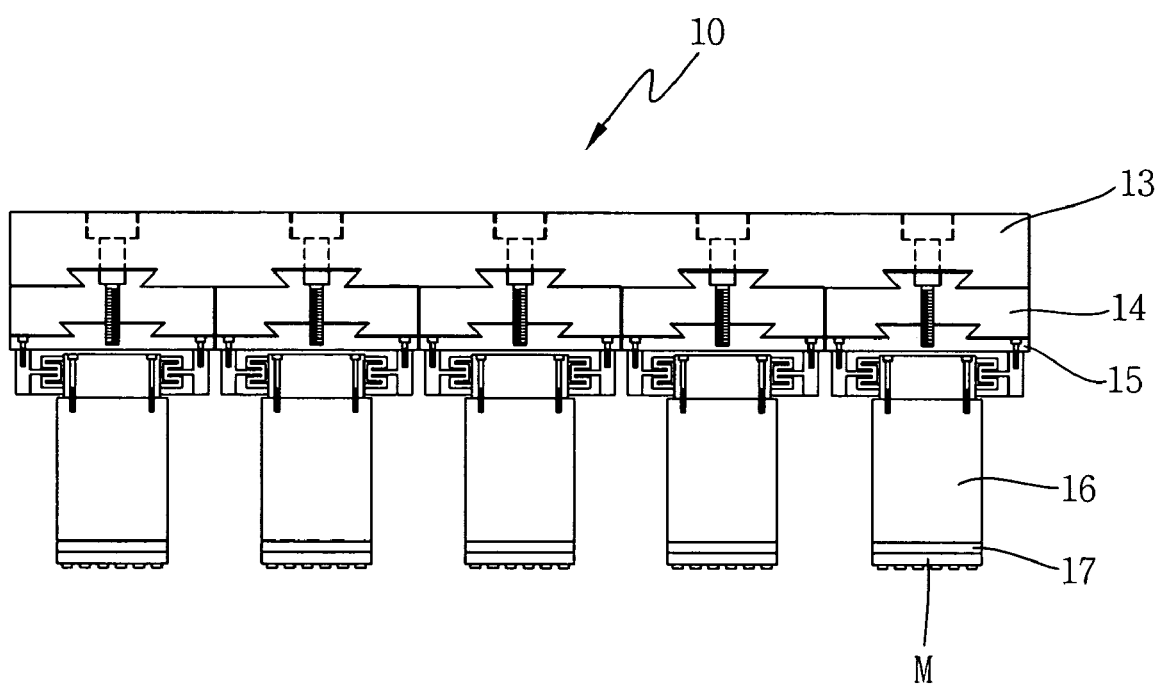
FIG. 8 is a front sectional view of the imprinting apparatus of FIG. 6.

As shown in FIGS. 6 through 8, the imprinting apparatus 10 of the present invention includes the plate unit 11, and the plurality of imprinting modules 12 which are provided on a lower surface of the plate unit 11 to be self-aligned by a compliance of six degrees of freedom in response to the surface conditions of the objective material W.

Thus, each of the imprinting modules 12 is vertically moved along with the plate unit 11 by the controller. Thereafter, each of the imprinting modules 12 is independently self-aligned in response to the surface conditions of the objective material W to compensate for the relative pose error of each of the imprinting modules 12 with respect to the objective material W. Therefore, the pattern P formed on a lower end of each of the plurality of imprinting modules 12 is imprinted on the upper surface of the objective material W within a predetermined unit range. Furthermore, the sequence of imprinting the patterns P of the plurality of imprinting modules 12 on the objective material W is variously controlled.

The detailed construction of the imprinting apparatus 10 with the above-mentioned operational function is as follows.

The plate unit 11 of the imprinting apparatus 10 of the present invention is vertically moved by a separate drive unit (not shown). Each of the plurality of imprinting modules 12 is provided on the lower surface of the plate unit 10 to be independently self-aligned by the compliance of the six degrees of freedom to imprint the pattern P formed on the lower end of each of the imprinting modules 12 on the upper surface of the objective material W.

Therefore, the plurality of imprinting modules 12 along with the plate unit 11 are vertically moved by the separate drive unit. That is, to execute the imprinting process, the plurality of imprinting modules 12 along with the plate unit 11 are moved downward. Thereafter, a mold M, provided on a lower portion of each of the plurality of imprinting modules 12, is near to the upper surface of the objective material W before the pattern P of the mold M is imprinted on the objective material W.

The plate unit 11 includes an upper panel 13 having a plate shape, and at least one block 14 which is removably mounted to a lower surface of the upper panel 13 in a dovetail jointing manner. The plate unit 11 further includes a plurality of adapters 15 which are removably mounted to a lower surface of the block 14 in a dovetail jointing manner. Each of the plurality of adapters 15 is mounted at a lower surface thereof to a compensator 18 of each of the plurality of imprinting modules 12 which will be described in detail later herein. At this time, the coupling between the upper panel 13 and the block 14, and between the block 14 and the plurality of adapters 15 is accomplished in the dovetail jointing manner. The number of the blocks 14, mounted to the upper panel 13, is selectively controlled according to the range of imprinting the patterns P on the objective material W.

Each of the blocks 14, jointed to the upper panel 13 in the dovetail jointing manner, is firmly fastened to the upper panel 13 by a plurality of first bolts B. Each of the plurality of adapters 15, jointed to the block 14 in the dovetail jointing manner, is firmly fastened to the block 14 by each of a plurality of second bolts B.

Figure 9:
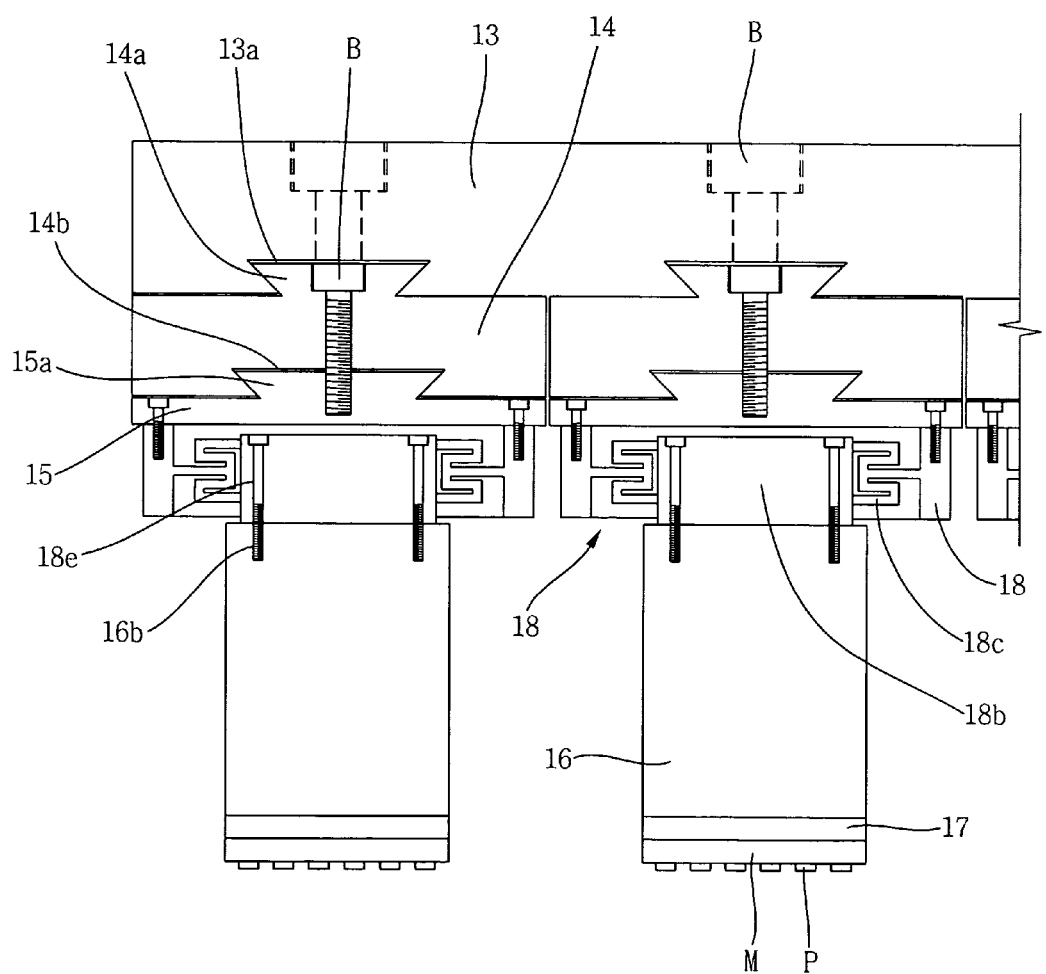
FIG. 9 is a partially enlarged sectional view showing a part of the imprinting apparatus of FIG. 8.
Figure 10:
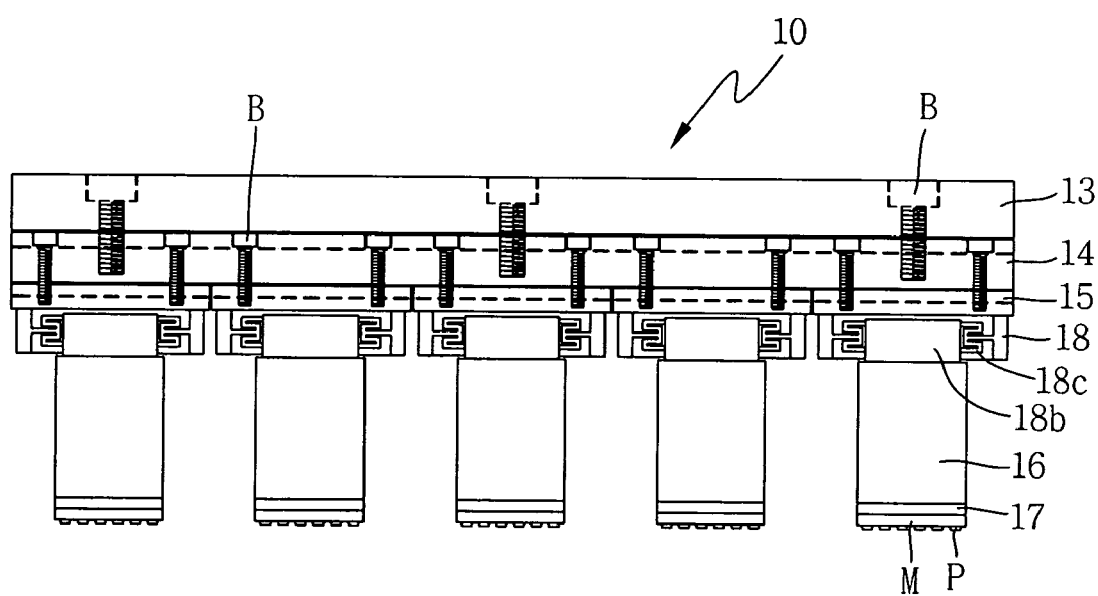
FIG. 10 is a side view of the imprinting apparatus of FIG. 6.
Figure 11:
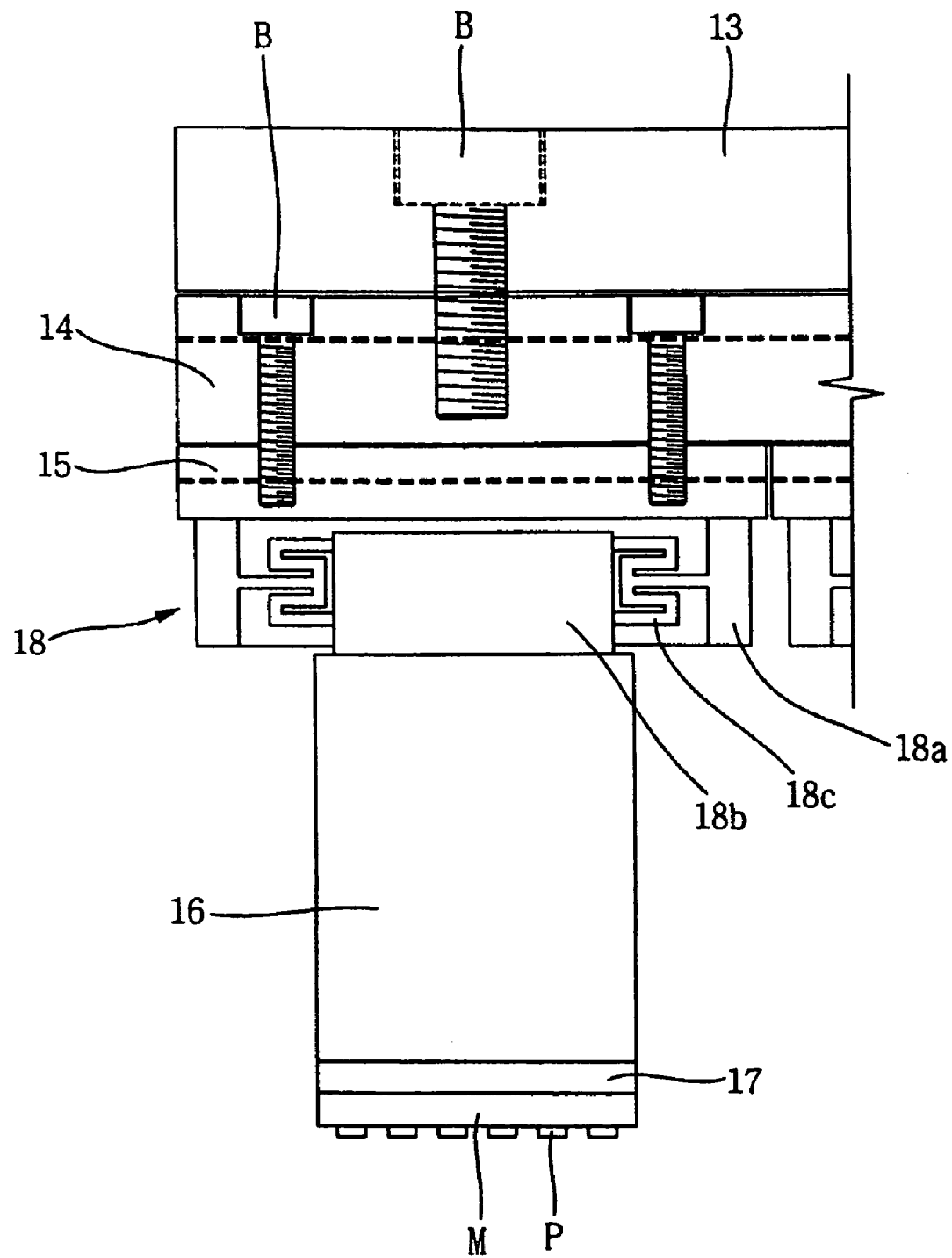
FIG. 11 is a partially enlarged sectional view showing a part of the imprinting apparatus of FIG. 10.

As show in FIGS. 8 and 9, the upper panel 13 has on the lower surface thereof at least one dovetail groove 13a, so that a dovetail 14a of the block 14 joints with the dovetail groove 13a of the upper panel 13. Preferably, the plurality of dovetail grooves 13a are provided on the lower surface of the upper panel 13 to be arranged in parallel to each other, so that the upper panel 13 is assembled with the plurality of the blocks 14.

To fasten each of the blocks 14, jointed to the upper panel 13 in the dovetail jointing manner, to the upper panel 13 using the plurality of first bolts B, the upper panel 13 further has a plurality first through holes 13b which are provided on predetermined portions to correspond to each of the dovetail grooves 13a.

The plurality of adapters 15 are mounted to the lower surface of each of the plurality of blocks 14 in the dovetail jointing manner, while the dovetail 14a of each of the plurality of blocks 14 joints with one of the plurality of dovetail grooves 13a of the upper panel 13. Thus, the plurality of adapters 15 are coupled to the upper panel 13 by the blocks 14.

Each of the blocks 14 has on the lower surface thereof a dovetail groove 14b, so that the plurality of adapters 15 are mounted to the lower surface of the blocks 14 in the dovetail jointing manner. Each of the blocks 14 further has a plurality of first coupling holes 14c which are provided on predetermined portions to correspond to the dovetail groove 14b, and into which the plurality of first bolts B passing through the first through holes 13b of the upper panel 13 are respectively tightened. Each of the blocks 14 further has a plurality of second through holes 14d through which the plurality of second bolts B respectively pass to mount the plurality of adapters 15 to the block 14.

The plurality of adapters 15 couple the plurality of imprinting modules 12 to each of the plurality of blocks 14. Each of the plurality of adapters 15 has a plate shape. The lower surface of each of the adapters 15 is evenly leveled to firmly fasten the compensator 18 of each of the plurality of imprinting modules 12 thereon.

Each of the plurality of adapters 15 has a dovetail 15a which is provided on an upper surface of the adapter 15 to joint with the dovetail groove 14b of the block 14. A plurality of third through holes 15b are provided around the dovetail 15a on the upper surface of each of the plurality of adapters 15. Thus, the compensators 18 of the imprinting modules 12 are firmly mounted to the lower surfaces of the adapters 15 by a plurality of third bolts B which are respectively tightened into the plurality of third through holes 15b.

As described above, the coupling between the upper panel 13 and the block 14, and between the block 14 and the plurality of adapters 15 is accomplished in the dovetail jointing manner. At this time, the above-mentioned dovetail jointing manner is a well-known manner typically used in conventional jointing structures.

In the meantime, each of the plurality of imprinting modules 12 is removably coupled to the upper panel 13 by each of the plurality of adapters 15 to imprint the pattern P of the mold M of each of the imprinting modules 12 on the upper surface of the objective material W.

Each of the plurality of imprinting modules 12 includes an actuator 16 which is finely actuated by the controller, and a bonding unit 17 to attach the mold M to a lower end of the actuator 16. Each of the imprinting modules 12 further includes the compensator 18 which is provided between the plate unit 11 and the actuator 16. Thus, each of the plurality of actuators 16, coupled to each of the plurality of compensators 16, is self-aligned by the compliance of six degrees of freedom in response to the conditions of the upper surface of the objective material W to compensate for a relative pose error of the mold M with respect to the objective material W.

Each of the plurality of actuators 16 is provided on the lower surface of each of the plurality of adapters 15, so that each of the actuators 16 is independently self-aligned by each of the compensators 18 during the process of imprinting the pattern P on the objective material W.

Each of the actuators 16 finely moves the mold M which is mounted to the lower end of the actuator 16, so that the pattern P of the mold M is imprinted on the objective material W.

Preferably, each of the actuators 16 is a PZT (piezoelectric) actuator of high precision actuation because the imprinting apparatus 10 of the present invention is generally used in nanotechnology fields.

Figure 14:
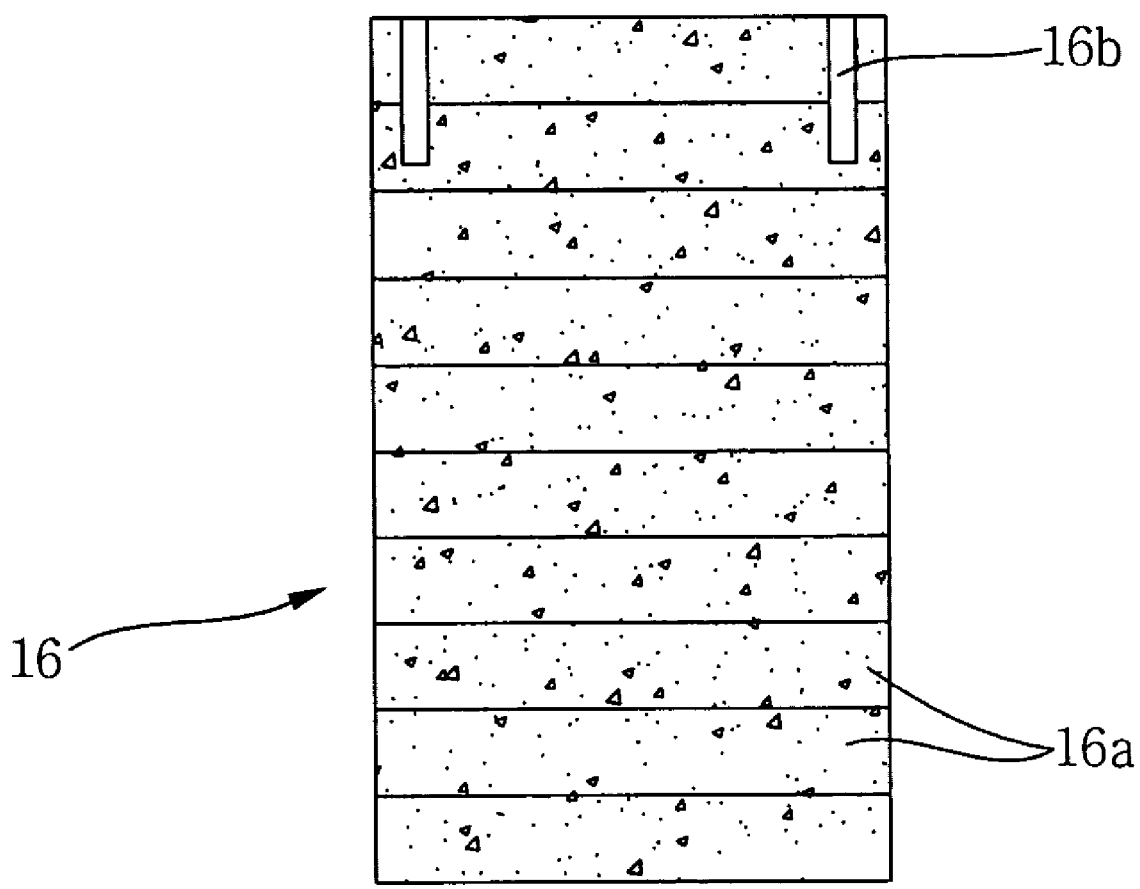
FIG. 14 is a sectional view of an actuator of the imprinting apparatus of FIG. 6.

As shown in FIG. 14, each of the actuators 16 has a plurality of unit pieces 16a which are arranged to be layered one on top of another. Each of the actuators 16 further has a plurality of third coupling holes 16b on an upper surface thereof, thus fastening each of the actuators 16 to the lower surface of each of the adapter 15 by the plurality of third bolts B.

Each of the actuators 16, which is the PZT actuator typically used in high precision actuating devices, is made of a predetermined material which expands in response to electricity supplied thereto by the controller.

That is, when the electricity is supplied to each of the actuators 16 by the controller (not shown), each of the actuators 16 finely expands. Thus, a length of each of the actuators 16 is finely increased. Due to the above-mentioned operation of each of the actuators 16, the mold M, mounted to the lower surface of each of the actuators 16, is in surface contact with the upper surface of the objective material W. Therefore, the pattern P of the molds M is imprinted on the objective material W. When the supply of the electricity is stopped, each of the expanded actuators 16 restores to the original state thereof, thus completing the imprinting process.

As described above, the length of each of the actuators 16 is controlled by supplying and interrupting the electricity, so that the pattern P can be repeatedly imprinted on each of a plurality of objective materials W. The PZT actuator, which is used as each of the actuators 16, is widely used in a variety of industrial fields, and further explanation is thus not deemed necessary.

In the meantime, a photosensitive film is used as the bonding unit 17 to attach the mold M to the lower surface of the actuator 16.

The bonding unit 17, which is the photosensitive film, is applied between the mold M and the actuator 16 to be hardened when exposed to ultraviolet rays to attach the mold M to the actuator 16. The bonding unit 17 has a function equal to that of a typical bonding agent.

Each of the plurality of compensators 18 is coupled to the plate unit 11 by each of the plurality of adapters 15. Each of the plurality of actuators 16 is coupled to the lower surface of each of the compensators 18.

Each of the compensators 18 allows that each of the actuators 16 is self-aligned by the compliance of six degrees of freedom. Thus, each of the actuators 16 executes a horizontal and vertical translational motion, a wobbling motion and a rotational motion in response to the conditions of the upper surface of the objective material W when the pattern P of each of the molds M is imprinted on the upper surface of the objective material W, thus compensating for a relative pose error of the mold M with respect to the objective material W.

Each of the compensators 18 includes an outer frame 18a comprising a body having a space S therein, and an inner frame 18b which is placed in the space S of the outer frame 18a, with the actuator 16 provided on the lower surface of the inner frame 18b. Thus, the inner frame 18b executes the vertical and horizontal translational motion, the wobbling motion and the rotational motion. Each of the compensators 18 further includes a plurality of inner connectors 18c to connect the inner frame 18b to the outer frame 18a while allowing the inner frame 18b to execute the vertical and horizontal translational motion, the wobbling motion and the rotational motion on a plane with respect to the outer frame 18a.

Due to the above-mentioned construction of the compensators 18, each of the actuators 16 along with the inner frame 18b of each of the compensators 18 is self-aligned by the compliance of six degrees of freedom including the vertical and horizontal translational motion, the wobbling motion and the rotational motion executed by elasticity of the plurality of inner connectors 18c, while the pattern P formed on each of the molds M is imprinted on the upper surface of the objective material W. Therefore, the actuators 16 are positioned to be perpendicular to the objective material W. Thus, the mold M of each of the actuators 16 is in parallel surface contact with the upper surface of the objective material W while the electricity is supplied to the actuator 16.

Even though the objective material W is curved on the upper surface thereon while the objective material W is supported on a vacuum chuck by an absorption method, the pattern P of each of the molds M is evenly imprinted on the objective material W by an independent compensating operation of each of the compensators 18.

Each of the inner connectors 18c of each of the compensators 18 is made of an elastic material to allow the inner frame 18b to be self-aligned, and, preferably, is made of a thin aluminum material.

Figure 12:
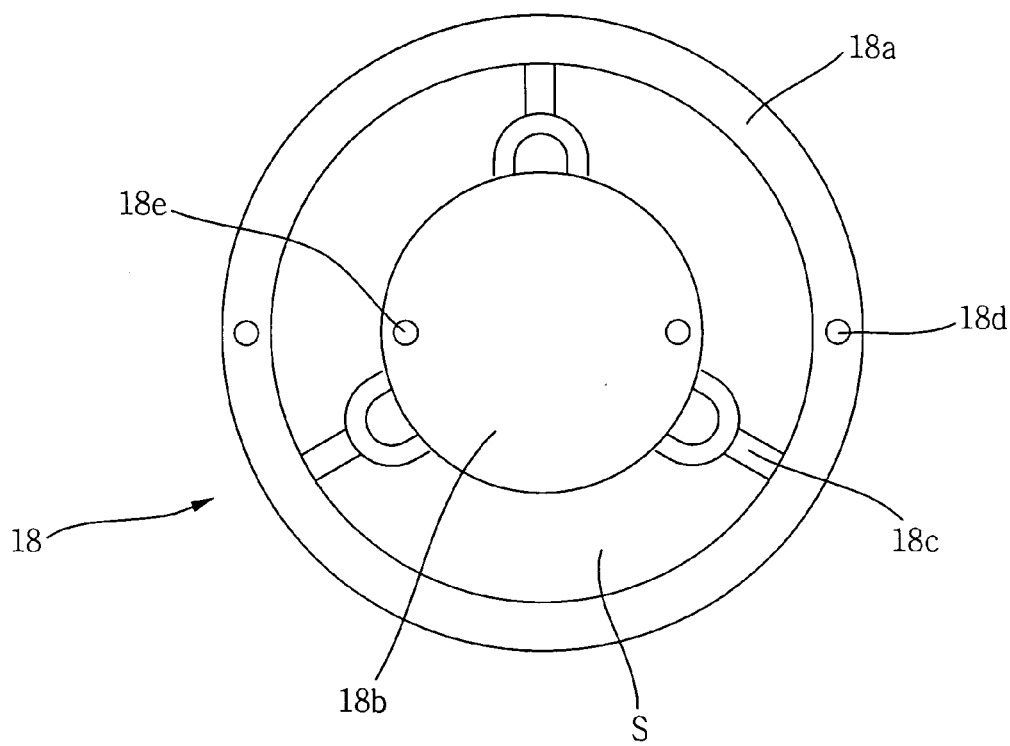
FIG. 12 is a plan view of a compensator of the imprinting apparatus of FIG. 6.

The outer frame 18a of each of the compensators 18 may have various shapes. The outer frame 18a of the imprinting apparatus according to the embodiment of the present invention has a ring shape, as shown in FIG. 12. A pair of third coupling holes 18d are provided on an upper end of each of the outer frames 18a to fasten the compensator 18 to the lower surface of the adapter 15 by the third bolts B.

The inner frame 18d of each of the compensators 18 has a plate shape. Each of the actuators 16 is mounted to a lower surface of each of the inner frames 18d. Each of the inner frames 18d has a pair of through holes 18e to fasten each of the actuators 16 to the lower surface of each of the inner frames 18d.

Each of the inner frames 18d is connected to each of the outer frames 18a through the plurality of connectors 18c. Therefore, each of the inner frames 18d allows for the self-alignment of each of the actuators 16 so that each of the actuators 16 is perpendicular to the objective material W during the process of imprinting the pattern P on the objective material W. Thus, the pattern P of each of the molds M is evenly imprinted on the upper surface of the material W.

Figure 13:
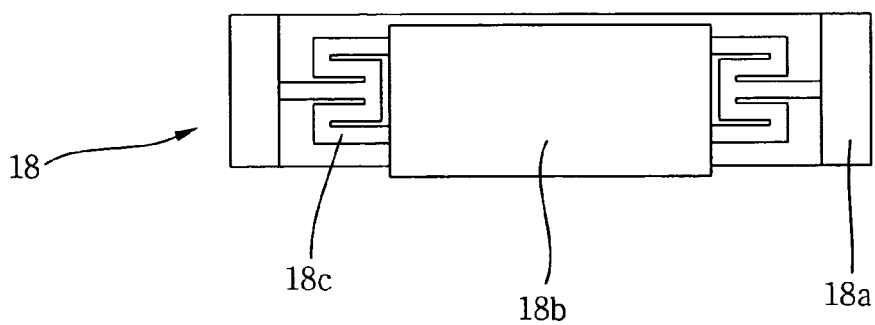
FIG. 13 is a sectional view of the compensator of FIG. 12.

As shown in FIG. 13, each of the thin connectors 18c has a zigzag-type pattern to ensure a desired elasticity. Both ends of each of the connectors 18c are respectively coupled to an inside surface of the outer frame 18a and an outside surface of the inner frame 18b.

Due to the connectors 18c of the zigzag-type patterns, each of the inner frames 18b executes the horizontal and vertical translational motion, the wobbling motion and the rotational motion. Therefore, the actuator 16, mounted to each of the inner frames 18b, is independently self-aligned to be perpendicular to the upper surface of the objective material W during the imprinting process.

In a brief description, the imprinting apparatus 10 of the present invention includes the plate unit 11 and the plurality of imprinting modules 12. The plate unit 11 has the upper panel 13, the plurality of blocks 14 which are mounted to the lower surface of the upper panel 13, and the plurality of adapters 15 which are mounted to the lower surface of each of the plurality of blocks 14. Each of the plurality of imprinting modules 12 has the compensator 18 which is mounted to the lower surface of each of the plurality of adapters 15, the actuator 16 which is mounted to the lower surface of the inner frame 18b of the compensator 18, and the mold M which is attached to the lower surface of the actuator 16 by the bonding unit 17.

The operation and effect of the imprinting apparatus 10 of the present invention will be described herein below.

The plurality of modules 12 along with the plate unit 11 are moved downward, so that each of the molds M having the pattern P is in contact with each of a plurality of photosensitive materials 19 which is previously applied to the upper surface of the objective material W. In the above state, when electricity is supplied to each of the actuators 16 by the controller, each of the actuators 16 finely expands, independently. Therefore, the mold M of each of the actuators 16 independently compresses each of the photosensitive materials 19, so that the pattern P of each of the molds M is imprinted on the upper surface of the objective material W.

Figure 15:
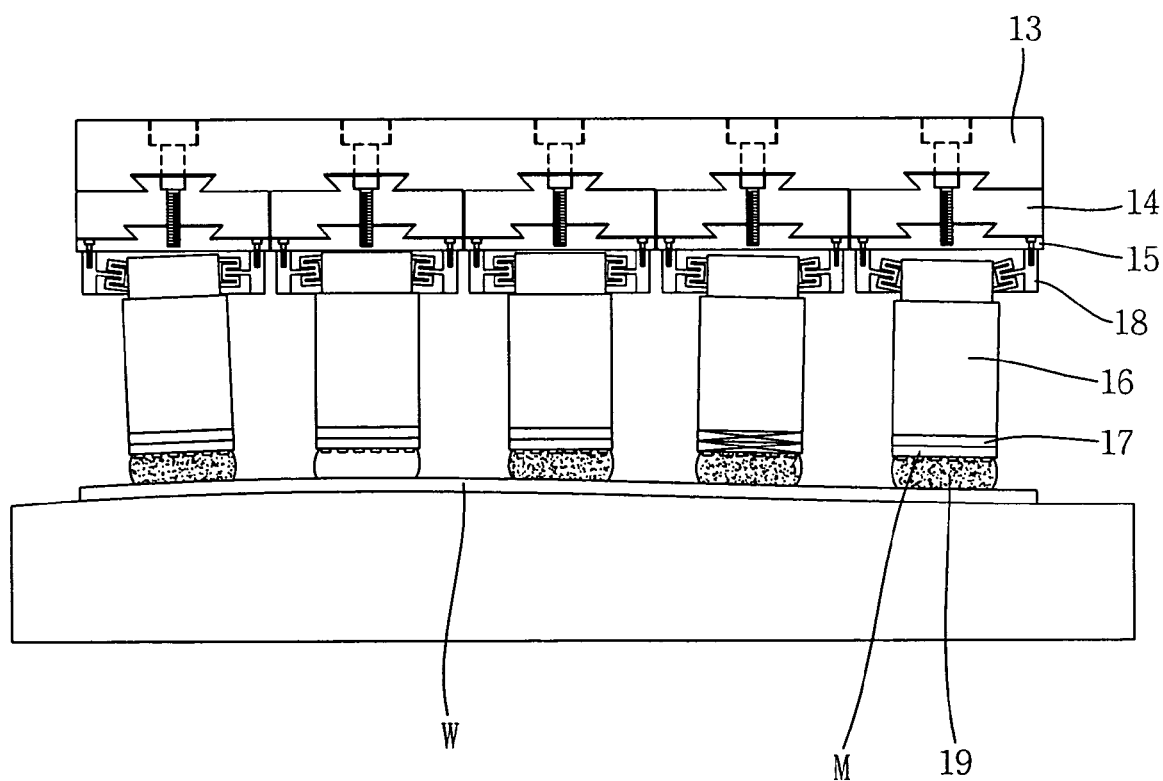
FIG. 15 is a sectional view showing an operation of the imprinting apparatus of FIG. 6.
Figure 16:
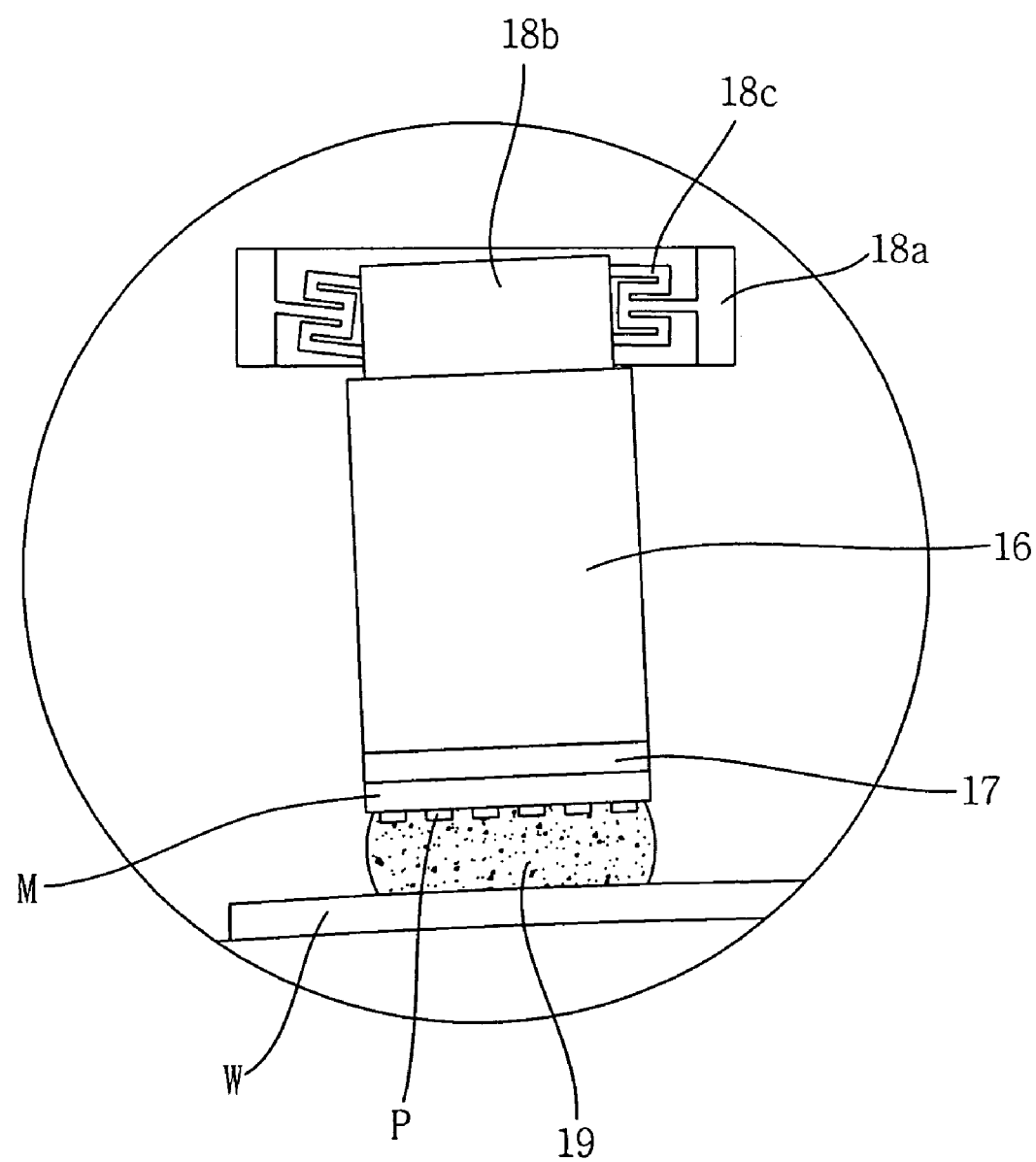
FIG. 16 is an enlarged sectional view of one of the plurality of imprinting modules of the imprinting apparatus of FIG. 15, in which the imprinting module with a pattern is independently self-aligned while the pattern is imprinted on the objective material.

As shown in FIGS. 15 and 16, even when the objective material W has a curved surface, the lower surface of each of the molds M must be in parallel surface contact with the curved upper surface of the objective material W.

To achieve the above state, the inner frame 18b of each of the compensators 18 independently executes the horizontal and vertical translational motion, the wobbling motion and the rotational motion of the compliance of six degrees of freedom. Thus, each of the actuators 16 is independently self-aligned to be perpendicular to the upper surface of the objective material W.

Therefore, even though the objective material W has the curved surface, as shown in FIGS. 15 and 16, each of the molds M is in parallel surface contact with the curved upper surface of the objective material W during the imprinting process. Thus, the pattern P of each of the molds M is precisely imprinted on the objective material W.

In the meantime, the plurality of actuators 16, mounted to the plate unit 11, may be simultaneously actuated, or be sequentially actuated according to a previously set process sequence under the control of the controller. Thus, a sequence of imprinting the patterns P on the objective material W is variously controlled. Furthermore, because each of the plurality of actuators 16 may be independently actuated, a sequence of separating the molds M from the objective material W is variously controlled after executing the imprinting process.

Particularly, the molds M may be separated from the objective material W according to the sequence designated by the numerals 1 through 4 in FIG. 5, that is, from the central portion to the outside portions of the objective material W, thus reducing a load required in the separating process.

In detail, after the patterns P of the molds M are imprinted on the objective material W, the molds M may be adhesively attached to the upper surface of the objective material W. Thus, to separate the molds M from the objective material W at a time, a large force will be applied to the imprinting apparatus 10. Therefore, the patterns P of the molds M may be undesirably damaged by the forcible separating process.

In the imprinting apparatus 10 of the present invention, the molds M are sequentially separated from the objective material W according to the previous set predetermined sequence. Therefore, the imprinting apparatus 10 of the present invention can avoid the above-mentioned problem in that the patterns P of the molds M may be undesirably damaged by the forcible separating process. In addition, the patterns P may be imprinted on the objective material W according to a previously set specific sequence.

Furthermore, the imprinting apparatus 10 of the present invention can variously control the process of imprinting the patterns P and the process of separating the molds M from the objective material W by independently controlling the actuators 16, different from conventional imprinting apparatuses.

As described above, the present invention provides an imprinting apparatus, in which each of a plurality of actuators, which is a high precision actuator, is mounted to each of a plurality of compensators, so that each of the actuators independently executes a horizontal and vertical translational motion, a wobbling motion and a rotational motion. Thus, each of the actuators is self-aligned to be perpendicular to an upper surface of an objective material according to conditions of the upper surface of the objective material on which patterns are imprinted.

Furthermore, a mold mounted to each of the actuators is in parallel surface contact with the upper surface of the objective material. Therefore, the pattern of each of the molds is precisely imprinted on the upper surface of the objective material even when the upper surface of the objective material is curved, thus reducing the number of defective products.

In addition, the plurality of actuators simultaneously or independently execute the process of imprinting the patterns on the objective material or the process of separating the molds from the objective material according to a previously set sequence under the control of a controller, thus increasing the quality of the products.

In the imprinting apparatus of the present invention, a plurality of blocks and adapters, by which the actuators are coupled to a plate unit, are removably mounted to an upper panel of the plate unit. Therefore, the number of the actuators is controlled by controlling the number of the blocks and the adapters in response to a range of imprinting the patterns on the objective material.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An imprinting apparatus, comprising:
a plate unit; and
a plurality of imprinting modules provided on a lower surface of the plate unit so that each of the plurality of imprinting modules is self-aligned by a compliance of six degrees of freedom, and is vertically moved along with the plate unit by a controller,
wherein each of the imprinting modules is independently self-aligned in response to surface conditions of an objective material to compensate for a relative pose error of each of the imprinting modules with respect to the objective material, so that a pattern formed on a lower end of each of the plurality of imprinting modules is imprinted on an upper surface of the objective material within a predetermined unit range, and a sequence of imprinting the patterns of the plurality of imprinting modules on the objective material is variously controlled.

2. The imprinting apparatus according to claim 1, wherein the plate unit vertically moved by a separate drive unit; and each of the plurality of imprinting modules provided on the lower surface of the plate unit to be independently self-aligned by the compliance of the six degrees of freedom to imprint the pattern formed on the lower end of each of the imprinting modules on the upper surface of the objective material, comprises:

an actuator provided under the plate unit to be independently actuated by the controller, with a mold attached on a lower end of the actuator and having the pattern on a lower surface thereof, so that the mold of the actuator is in surface contact with the upper surface of the objective material while the actuator is actuated by the controller;

a bonding unit provided between the lower end of the actuator and the mold to attach the mold to the lower end of the actuator; and a compensator comprising an outer frame provided on the lower surface of the plate unit, and an inner frame placed in the outer frame so that the inner frame is self-aligned by the compliance of six degrees of freedom, the inner frame having on a lower end thereof the actuator, so that the actuator along with the inner frame executes a horizontal and vertical translational motion, a wobbling motion and a rotational motion in response to the conditions of the upper surface of the objective material when the pattern of the mold is imprinted on the upper surface of the objective material, thus compensating for a relative pose error of the mold with respect to the objective material.

3. The imprinting apparatus according to claim 2, wherein the plate unit comprises:

an upper panel having a plate shape;

at least one block mounted to a lower surface of the upper panel in a dovetail jointing manner; and a plurality of adapters mounted to a lower surface of the block in a dovetail jointing manner, so that the compensator of each of the plurality of imprinting modules is provided on a lower end of the adapter, wherein the block jointed to the upper panel in the dovetail jointing manner is fastened to the upper panel by a first bolt, and each of the plurality of adapters jointed to the block in the dovetail jointing manner is fastened to the block by a second bolt.

4. The imprinting apparatus according to claim 2, wherein the bonding unit is a photosensitive film which is applied between the mold and the actuator to be hardened when exposed to ultraviolet rays to attach the mold to the actuator.

5. The imprinting apparatus according to claim 2, wherein the compensator of each of the plurality of imprinting modules comprises:

the outer frame comprising a body having a space therein;

the inner frame placed in the space of the outer frame so that the inner frame executes the vertical and horizontal translational motion, the wobbling motion and the rotational motion, with the actuator provided on the lower surface of the inner frame; and a plurality of inner connectors to connect the inner frame to the outer frame while allowing the inner frame to execute the vertical and horizontal translational motion, the wobbling motion and the rotational motion on a plane with respect to the outer frame, wherein the actuator along with the inner frame is self-aligned by elasticity of the plurality of inner connectors while the pattern formed on the mold of the actuator is imprinted on the upper surface of the objective material.

6. The imprinting apparatus according to claim 3, wherein each of couplings between the upper panel and the block, and between the block and the plurality of adapters is accomplished in the dovetail jointing manner.

* * * * *